(12) United States Patent
Mukai et al.

(10) Patent No.: US 10,249,572 B2
(45) Date of Patent: Apr. 2, 2019

(54) METHOD FOR ELECTROMAGNETIC SHIELDING AND THERMAL MANAGEMENT OF ACTIVE COMPONENTS

(71) Applicant: Atotech Deutschland GmbH, Berlin (DE)

(72) Inventors: Kenichiroh Mukai, Englewood, CO (US); Kwonil Kim, Englewood, CO (US); Lee Gaherty, Englewood, CO (US); Lutz Brandt, Berlin (DE); Tafadzwa Magaya, Englewood, CO (US)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 15/536,185

(22) PCT Filed: Dec. 22, 2015

(86) PCT No.: PCT/EP2015/002594
§ 371 (c)(1),
(2) Date: Jun. 15, 2017

(87) PCT Pub. No.: WO2016/102066
PCT Pub. Date: Jun. 30, 2016

(65) Prior Publication Data
US 2017/0330861 A1  Nov. 16, 2017

(30) Foreign Application Priority Data
Dec. 22, 2014  (EP) .................................... 14199574

(51) Int. Cl.
*H01L 25/00* (2006.01)
*H01L 23/552* (2006.01)
(Continued)

(52) U.S. Cl.
CPC ........ *H01L 23/552* (2013.01); *C23C 18/1605* (2013.01); *C23C 18/1641* (2013.01);
(Continued)

(58) Field of Classification Search
CPC ........................... H01L 25/50; H01L 25/0657
(Continued)

(56) References Cited

U.S. PATENT DOCUMENTS 3,011,920 A    12/1961  Shipley, Jr.
3,995,371 A *  12/1976  O'Keefe ............. A61K 6/0017
                                                 427/304
(Continued)

FOREIGN PATENT DOCUMENTS

CN    202443968    9/2012
JP    2005109306   4/2005
(Continued)

OTHER PUBLICATIONS

Rehman Atteq Ur et al: "Copper conducting electrode with nickel as a seed layer for selective emitter crystalline silicon solar cells", Journal of the Korean Physical Society, Korean Physical Society, KR, vol. 65, No. 5, Sep. 24, 2014, pp. 739-744.
(Continued)

*Primary Examiner* — Mohammad M Choudhry
(74) *Attorney, Agent, or Firm* — Renner, Otto, Boisselle & Sklar, LLP

(57) ABSTRACT

The present invention concerns a method for forming a metal layer for electromagnetic shielding and thermal management of active components, preferably by wet chemical metal plating, using an adhesion promotion layer on the layer of molding compound and forming at least one metal layer on the adhesion promotion layer or forming at least one metal layer on the adhesion promotion layer by wet chemical metal plating processes.

17 Claims, 1 Drawing Sheet

(51) Int. Cl.
*H01L 23/29* (2006.01)
*H01L 23/31* (2006.01)
*H01L 23/373* (2006.01)
*C23C 18/16* (2006.01)
*C23C 18/28* (2006.01)
*C23C 18/30* (2006.01)
*C23C 18/36* (2006.01)
*C23C 18/40* (2006.01)
*C23C 18/42* (2006.01)
*C23C 18/50* (2006.01)
*C23C 18/54* (2006.01)
*H01L 21/48* (2006.01)
*H01L 21/02* (2006.01)

(52) U.S. Cl.
CPC ...... *C23C 18/1651* (2013.01); *C23C 18/1653* (2013.01); *C23C 18/1698* (2013.01); *C23C 18/285* (2013.01); *C23C 18/30* (2013.01); *C23C 18/36* (2013.01); *C23C 18/405* (2013.01); *C23C 18/42* (2013.01); *C23C 18/50* (2013.01); *C23C 18/54* (2013.01); *H01L 21/02211* (2013.01); *H01L 21/02282* (2013.01); *H01L 21/02301* (2013.01); *H01L 21/4871* (2013.01); *H01L 23/295* (2013.01); *H01L 23/3135* (2013.01); *H01L 23/3142* (2013.01); *H01L 23/3735* (2013.01); *H01L 23/3736* (2013.01); *H01L 21/02076* (2013.01); *H01L 23/3121* (2013.01); *H01L 23/3128* (2013.01); *H01L 25/50* (2013.01); *H01L 2924/15311* (2013.01)

(58) Field of Classification Search
USPC .......................................................... 438/107
See application file for complete search history.

(56) References Cited

U.S. PATENT DOCUMENTS

| | | | |
|---|---|---|---|
| 6,365,030 B1 * | 4/2002 | Yoshimura | B24B 31/14 205/143 |
| 8,062,930 B1 | 11/2011 | Shah et al. | |
| 9,218,141 B2 * | 12/2015 | Montgomery | G06F 3/0608 |
| 2002/0090738 A1 * | 7/2002 | Cozzette | B01L 3/0268 436/518 |
| 2002/0142094 A1 * | 10/2002 | Fukushima | H01B 1/22 427/214 |
| 2005/0127147 A1 * | 6/2005 | Kao | B23K 1/0016 228/254 |
| 2007/0116970 A1 * | 5/2007 | Kato | C09D 183/10 428/447 |
| 2008/0182387 A1 | 7/2008 | Feng et al. | |
| 2009/0029506 A1 | 1/2009 | Fujii et al. | |
| 2010/0172116 A1 | 7/2010 | Yorita et al. | |
| 2015/0050422 A1 | 2/2015 | Tews et al. | |
| 2015/0083602 A1 | 3/2015 | Nichols et al. | |

FOREIGN PATENT DOCUMENTS

| | | |
|---|---|---|
| JP | 2008156702 | 7/2008 |
| JP | 2010212410 | 9/2010 |
| JP | 2014183181 | 9/2014 |

OTHER PUBLICATIONS

Atteq Ur Rehman and Soo Hong Lee: "Review of the Potential of the Ni/Cu Plating Technique for Crystalline Silicon Solar Cells", Materials, vol. 7, Feb. 18, 2014, pp. 1318-1341.

Tai, Min Fee et al: "Adhesion enhancement for electroless plating on mold compound for EMI shielding with industrial test compliance" ICSE, 2014, pp. 313-316.

PCT/EP2015/002594; PCT International Search Report and Written Opinion of the International Searching Authority dated Mar. 2, 2016.

PCT/EP2015/002594; PCT International Preliminary Report on Patentability dated Mar. 31, 2017.

Official Action for corresponding Chinese Application No. 201580070483.5 dated Nov. 23, 2018.

Official Action for corresponding Japanese Application No. 2017-533873 dated Aug. 30, 2018.

* cited by examiner

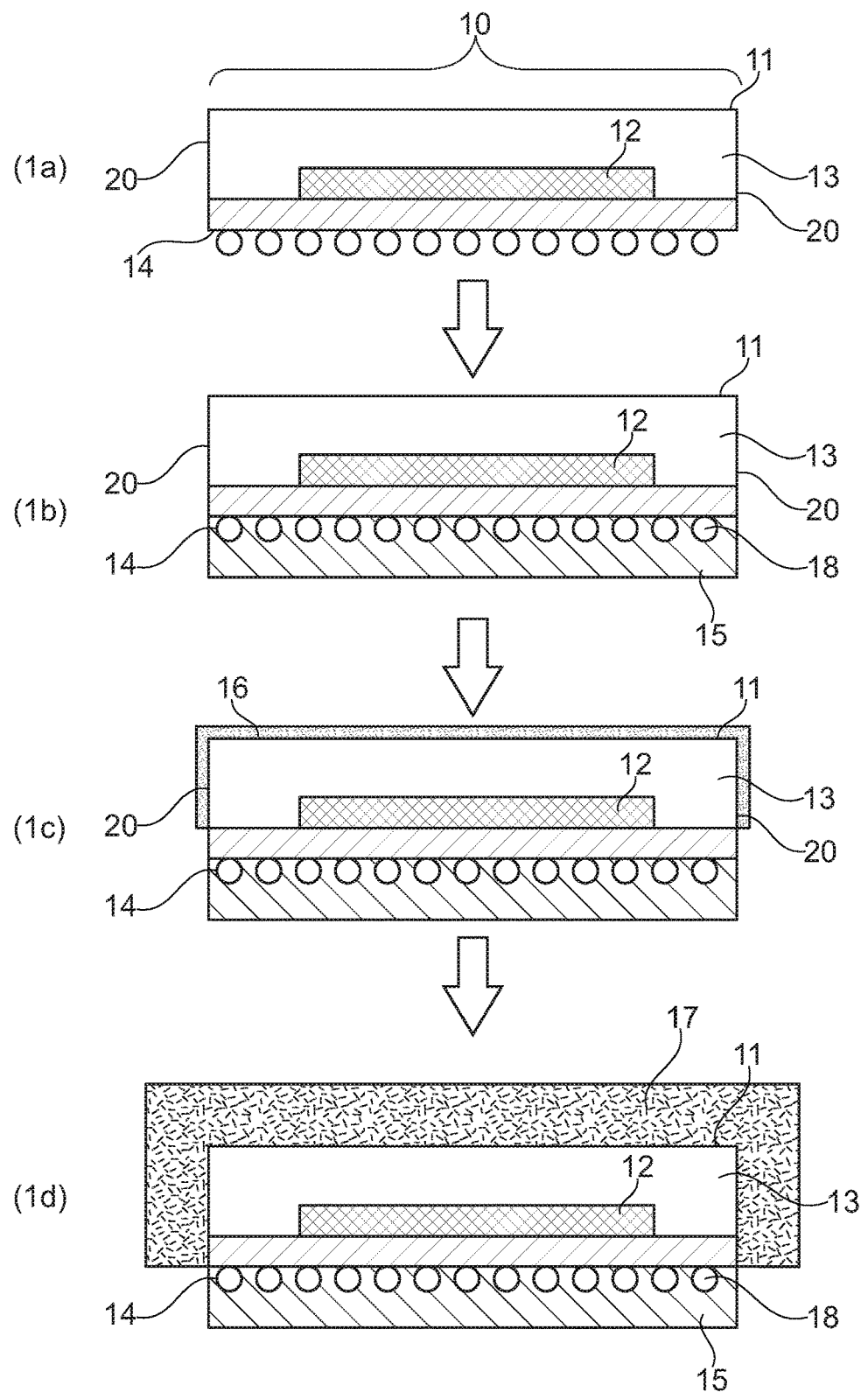

METHOD FOR ELECTROMAGNETIC SHIELDING AND THERMAL MANAGEMENT OF ACTIVE COMPONENTS

The present application is a U.S. National Stage Application based on and claiming benefit and priority under 35 U.S.C. § 371 of International Application No. PCT/EP2015/002594, filed 22 Dec. 2015, which in turn claims benefit of and priority to European Application No. 14199574.6 filed 22 Dec. 2014, the entirety of both of which is hereby incorporated herein by reference.

FIELD OF THE INVENTION

The present invention relates to a method for electromagnetic shielding of active components and thermal management.

BACKGROUND OF THE INVENTION

Electronic consumer devices become more and more powerful, smaller and faster. This is particularly true for handheld devices like smart phones, which have become immensely popular thanks to their vast functionality combined with their relatively small size. The performance of such devices relies on high clock speeds and small integrated circuit modules.

Prerequisite for high clock speed is high signal speed which creates electromagnetic emissions throughout the electromagnetic spectrum. Such emissions need to be shielded, particularly when the circuits (active components) are positioned very close to each other.

High signal strength and electromagnetic emissions likely result in interference with the operation of the electronic component. This phenomenon is sometimes called electromagnetic interference (EMI) or crosstalk. Shielding is widely used to avoid such interference.

Many component types in electronic devices require such shielding. For example, sub-modules making up the module may need to be shielded from EMI transmissions.

Various methods are known for magnetic or electrical EMI shielding of active components. This is currently predominantly done by metallic cans. However, this technique increases the space requirements, which is detrimental to the trend of miniaturization.

U.S. Pat. No. 8,062,930 B1 addresses the need to reduce space requirements of the can for shielding. Described as a manufacturing process of a submodule having an electromagnetic shield. Initially, a meta-module having circuitry for two or more sub-modules is formed. An overmold body is placed over the circuitry for all of the sub-modules. The overmold body of the metamodule is sub-diced to expose a metallic layer grid around each of the submodules. Next, an electromagnetic shield is applied to the exterior surface of the overmold body of each of the sub-modules and in contact with the metallic layer grid. The meta-module is then singulated to form modules having two or more sub-modules.

An important requirement for those metallized packaged active components is that the I/O (electrical input/output) side of the package is protected from additional metallization as this would lead to shorting of the I/Os.

A related application is the thermal management or dissipation of heat created by active components using a conformal, single-sided metallized layer. Undissipated heat, which is related to the electrical power consumption of the active components can build up to high temperatures (exceeding 150° C.), ultimately deteriorating or destroying the functionality of the active component or chip. Similar as in the EMI shielding application the I/O side has to be protected from additional metallization to prevent shorting of the I/Os.

Thus, there is a need for conformal, single-sided shielding processes capable of effectively and selectively shielding small scale devices and which do not significantly add to the size of the electronic components.

SUMMARY OF THE INVENTION

This objective is solved by a method for forming a metal layer for electromagnetic shielding and thermal management of active components (substrate), preferably by wet chemical metal plating, comprising the following steps
  (i) providing at least one active component (10), said active component having a front side (11) comprising at least one chip (12) encased by a layer of molding compound (13), a back side (14) and side walls (20);
  (ii) forming on the back side a protective layer (15);
  (iii) forming on the front side (11) and optionally on the side walls (20) an adhesion promotion layer (16) on the layer of molding compound (13);
  (iv) forming at least one metal layer (17) on the adhesion promotion layer
  or
  forming at least one metal layer (17) on the adhesion promotion layer by wet chemical metal plating processes.

BRIEF DESCRIPTION OF THE FIGURES

FIGS. 1(a)-1(d) show a method for forming a metal layer for electromagnetic shielding and thermal management according to the present invention.

DETAILED DESCRIPTION OF THE INVENTION

The method according to the present invention is based on a chemical adhesion promoter, where components encased by a molding compound are directly coated with a metal layer or directly coated with a metal layer by wet chemical plating methods. Particularly suitable are methods for providing an electroless copper or copper alloy layer or nickel or nickel alloy layer. By this method spatial requirements are minimized. Also, this process fits into the existing infrastructure of the electronics and printed circuit boards (PCB) industry.

There are several challenges in metallizing molding compounds with wet chemical plating methods. Firstly, molding compounds have a high filler content (70-90% wt.) with a wide size distribution ranging from a few nm to tens of μm. Secondly, molding compounds, unlike build-up resins, have not been optimized for adhesion to plated metal and even contain waxy release agents which counteract adhesion. For this reason, classical desmear, e.g. by a permanganate salt like potassium permanganate in aqueous solution, followed by electroless seeding can get a maximum adhesion of up to 2 N/cm on typical molding compound. This adhesion is insufficient to prevent delamination in subsequent treatment steps for most electronics applications.

Preferably in the method of the present invention the molding compound comprises 50 to 95 wt.-% of a glass filler, more preferably the molding compound comprises 50 to 95 wt.-% silicon oxide (as glass filler), based on the total weight of the molding compound. More preferably the molding compound is not a build-up resin.

By a method according to the present invention, metal layers can be deposited, which show high adhesion with an adhesion strength of up to 5 N/cm. The plated metal layer stands up well to the thermal reliability tests such as reflow shock (at a temperature of 260° C.) and HAST treatment. Metal layers obtained by a method according to the present invention exhibit no delamination or significant loss of adhesion.

The present invention is directed to providing improved methods for electromagnetic shielding and thermal management of active components.

Various EMC (epoxy molding compound) active components (substrates) can be treated with the method according to the present invention. The substrates are for example selected from pre-diced strips, singulated chips with solder balls or singulated chips without solder balls.

The active components (substrates) are usually first cleaned in deionized water or a standard cleaning bath to remove loose debris and particles from the surface.

Additional pre-treatment may include plasma cleaning or etching in a solution containing an oxidizing agent like potassium or sodium permanganate. Such methods are well known in the art.

Thereafter or even before the cleaning step, the back side of the active components (substrates) (FIG. 1, (14)) is to be protected in order to avoid contact with subsequent treatment solutions and because the back side is not to be metallized. The incoming singulated chips/strips (w/ Sub-Diced) generally have a solder resist, a gold metal finishing or solder balls (FIG. 1, (18)) on their back side (I/O side protection). This side has to be protected from the treatment solutions used in a method according to the present invention, for example from the wet chemical metal plating solutions. In manufacturing, this protection is a key requirement and can be achieved for instance by the application of an adhesive tape, a UV peelable tape and a layer of temporary ink, or temporary gaskets. The adhesive tape can be a polyester film tape with a conformable silicone base adhesive tape (eg. 3M Circuit Plating Tape 851), which is applied by vacuum lamination.

The temporary ink is a commercial product and for example available from Lackwerke Peters GmbH+Co KG. A suitable family of products is SD2955 from Lackwerke Peters. These products are also used as peelable solder masks that can be easily removed. The person skilled in the art can select the most suitable peelable ink in accordance with the substrate material to be covered and the specific application.

An adhesive tape can be used to form the protective layer (15) of the back side of the active component (substrate) 10, see FIG. 1. The tape can be provided in form of a foil which is applied from a drum on the back side of the substrate. Removal would be via treatment with UV light after step (iv), which results in unbonding of the tape.

If the back side (14) of the active component (substrate) 10 contains solder balls (18) formation of a protective layer is not possible by applying a tape, since the tape cannot provide effective sealing of the surface and treatment liquids can seep in and come in contact with the back side of the substrate material. In case solder balls are attached to the back side, a peelable ink is preferably used to form the protection layer. In this embodiment, the back side (14) of the active component is placed over the ink surface and the ink pressed into the surface to form a tight protection layer.

Thereafter the chemical adhesion promoter is applied to the non-protected front side (11) and optionally to the side walls (20) of the substrate to form an adhesion layer (16). The chemical adhesion promoter preferably comprises one or more than one organic compound, more preferably is selected from one or more silane compounds. This applies also to the adhesion promotion layer. More preferably, the adhesion promotor and the adhesion promotor layer, respectively, do not contain iron, nickel and zinc.

The silane compound more preferably is an organosilane compound. The organosilane compound is applied as a solution, preferably a solution of an organic solvent having a high boiling point, preferably in the range of 60 to 250° C. and more preferred in the range of 80 to 200° C. Organic solvents within the meaning of this invention are polar organic solvents suitable to dissolve silane compounds.

Suitable organic solvents comprise alcohols, ethers, amines, and acetates. Examples are ethanol, 2-propanol, tetrahydrofuran, ethylene glycol, diethyleneglycol, 2-isopropoxyethanol (IPPE), di(propyleneglycol)methyletheracetate (DPGMEA), 2-ethyl-1-hexanol, glycerine, butyrolacton, N-methyl pyrrolidone (NMP), dimethyl formamide, dimethylacetamide, ethanolamine, propylene glycol methyl ether acetate (PMA), half ethers and half esters of ethylene glycols.

The concentration of the organosilane compound can vary over a wide range depending on the application and the specific compound. The suitable concentration can be obtained by routine experiments. Suitable concentration generally vary between as low as 0.1 wt. % to 30 wt. %, preferably between 0.5 wt. % to 20 wt. %, even more preferred between 1 wt. % and 8 wt. %.

Contacting the dielectric substrates with a solution containing organosilane compounds according to method step (iii) is performed by dipping or immersing the substrates into said solution; or by spraying the solution to the substrates. Contacting the substrate with a solution containing organosilane compounds according to method step (iii) is performed at least once. Alternatively said contacting can be performed several times, preferably between 2 to 10 times, more preferred between 2 to 5, even more preferred between 1 to 3 times.

Contacting the substrate with a solution containing organosilane compounds according to method step (iii) is performed for a time period ranging from 10 seconds to 20 minutes, preferred from 10 seconds to 10 minutes, most preferred from 10 seconds to 5 minutes.

Contacting the substrate with a solution containing organosilane compounds according to method step (iii) is performed at a temperature ranging from 15 to 100° C., preferred from 20 to 50° C., most preferred from 23 to 35° C.

The thickness of the layer of the silane based adhesion promoter can vary and usually has a thickness of between 5 to 100 nm.

The organosilane compound is preferably selected from the group represented by the following formula $$A_{(4-x)}SiB_x$$

wherein
each A is independently a hydrolyzable group,
x is 1 to 3, and
each B is independently selected from the group consisting of $C_1$-$C_{20}$ alkyl, aryl, amino aryl and a functional group represented by the formula $$C_nH_{2n}X,$$

wherein
n is from 0 to 15, preferably 0 to 10 even more preferably 1 to 8, most preferably 1, 2, 3, 4 and X is selected from the group consisting of amino, amido, hydroxy, alkoxy, halo, mercapto, carboxy, carboxy ester, carboxamide, thiocarboxamide, acyl, vinyl, allyl, styryl, epoxy, epoxycyclohexyl, glycidoxy, isocyanato, thiocyanato, thioisocyanato, ureido, thioureido, guanidino, thioglycidoxy, acryloxy, methacryloxy groups; or X is a residue of a carboxy ester; or X is $Si(OR)_3$, and wherein R is a $C_1$-$C_5$ alkyl group.

Preferably, the hydrolyzable group A is selected from the group consisting of —OH, —$OR^1$ and wherein $R^1$ is $C_1$-$C_5$ alkyl, —$(CH_2)_y OR^2$ and wherein y is 1, 2 or 3 and $R^2$ is H or $C_1$-$C_5$ alkyl, —$OCOR^3$ and and wherein $R^3$ is H or $C_1$-$C_5$ alkyl.

If B is an alkyl group it is preferably a $C_1$-$C_{10}$ alkyl, even more preferred $C_1$-$C_5$ alkyl group like methyl, ethyl, propyl or isopropyl. Preferred aryl groups are phenyl- and benzyl-groups, either substituted or unsubstituted. A preferred amino aryl group is —$NH(C_6H_5)$.

Functional groups X within the meaning of this invention can be further functionalized. For example X=amino comprises alkylamine- or arylamine substituted amines like 3-(N-Styrylmethyl-2-aminoethylamino).

For the functional group X being $Si(OR)_3$, R preferably is methyl, ethyl, propyl or isopropyl.

Examples of particular classes of compounds within the formulas above are vinylsilanes, aminoalkylsilanes, ureido-alkylsilane esters, epoxyalkylsilanes and methacryloalkylsilane esters, in which the reactive organic functions are, respectively, vinyl, amino, ureido, epoxy and methacryloxy. Examples of the vinylsilanes are vinyltrichlorosilane, vinyltriethoxysilane, vinyltrimethoxysilane, vinyl-tris-(beta(2)-methoxyethoxy) silane and vinyltriacetoxysilane. As examples of the aminoalkylsilanes, which are the preferred organosilanes for use in the present invention, are gamma (3)-aminopropyltriethoxysilane, gamma-aminopropyltrimethoxysilane, N-beta-(Aminoethyl)-gamma-aminopropyltrimethoxysilane, and N'-(beta-aminoethyl)-N-(beta-aminoethyl)-gamma-aminopropyltrimethoxysilane. A suitable ureidoalkylsilane ester is gammaureidoalkyltriethoxysilane, while suitable expoxyalkylsilanes are beta-(3,4-epoxycyclohexyl)-ethyltrimethoxysilane and gammaglycidoxypropyltrimethoxysilane. Useful methacryloxysilane esters are gamma-methacryloxypropyltrimethoxy silane and gamma-methacryloxypropyl-tris-(beta-methoxyethoxy) silane.

The at least one organosilane compound can either be a monomeric organosilane compound or an oligomeric organosilane compound which is obtained by a (partial) hydrolyzation and condensation of a monomeric organosilane compound according to the present invention prior to the deposition onto the surface of the dielectric substrate.

The hydrolysis and condensation of organosilane compounds is well known in the art. For example, the monomeric organosilane compound is reacted with an acidic catalyst, for example, acetic acid or diluted hydrochloric acid leading to a clear solution of an oligomeric organosilane compound derived from the monomeric organosilane compound.

Such oligomeric silanes derived from monomeric organosilane compound according to the present by hydrolization shall be included into the scope of the present invention.

Optionally, the substrate can be heat treated after this method step. Such treatment is generally performed at a temperature between 60-200° C., more preferred between 80-150° C. The treatment time can vary, e.g. between 1 and 30 minutes, preferred between 1 and 10 minutes.

Thereafter, the front side (11) and optionally the side walls (20) of the active component (substrate) bearing the layer of adhesion promoter are treated to provide a first conductive seed layer (17).

Forming at least one metal layer according to step (iv) for example comprises iva. contacting the substrate with a noble metal colloid or a noble metal ion containing solution;

ivb. contacting the substrate with at least one electroless metal plating solution to form a first metal layer;

ivc. optionally, contacting the substrate with at least one electrolytic metal plating solution to form a second metal layer; and ivd. optionally, contacting the substrate with at least one electrolytic metal plating solution to form a third metal layer.

Application can e.g. be by spraying the solution to provide a first conductive seed layer or by dipping the substrate into the solution to provide a first conductive seed layer.

For step (iv) several methods for plating a metal onto a substrate by applying a wet-chemical plating method are known to the person skilled in the art. According to the present invention the wet chemical plating method preferably is an electrolytic plating method, an immersion plating process or an electroless plating method.

In step (iv) of the method of the present invention most preferred is forming at least one metal layer (17) on the adhesion promotion layer by wet chemical metal plating processes.

The substrate surface bearing the adhesion promotion layer can be metallised after activation by using an electroless metallising method or alternatively by using a direct plating method (electrolytic plating method). A typically activation of substrates like active components for subsequent metal plating is performed as follows:

Preferably, the first metal layer comprises copper or copper alloy and is deposited by electroless plating. Preferably in this case, the substrate is activated by e.g., deposition of a noble metal containing colloid or a solution comprising noble metal ions prior to electroless deposition of copper. The most preferable activation is by deposition of palladium-tin colloids or palladium ions. Such methods are established in the art and known to the skilled person.

Instead of copper the first metal layer can comprise nickel. Nickel includes nickel alloys like nickel boron and nickel iron alloys.

For electroless metallisation, the objects or the substrates can first be rinsed after the acceleration or treatment with reducing agent solution and then electrolessly plated with nickel. A suitable nickel bath contains a number of substances including nickel sulfate, a hypophosphite, for example sodium hypophosphite, as a reducing agent, and organic complexing agents, for example sodium citrate, and pH adjusting agents (for example a buffer).

As an alternative, an electroless copper bath can be used which typically contains a copper salt, for example copper sulfate or copper chloride, and also a reducing agent such as formaldehyde, and also one or more complexing agents such as EDTA (ethylenediamine tetraacetate), citric acid, tartaric acid, as well as a pH adjusting agent such as sodium hydroxide.

Thereafter, a second metal layer can be deposited by electroless or electrolytic deposition techniques, also called galvanic plating. It depends on the EMI shielding requirements or thermal management needs, whether such a second metal layer is required and what layer thickness is most suitable. Generally, the thickness of the metal layer is higher for thermal management applications than EMI shielding applications. Preferably, the substrate contains at least a second metal layer and may optionally contain further metal layers.

In some cases it is preferred that the second metal layer is deposited onto the first metal layer by electroless deposition techniques. More preferably both the first and the second metal layer are deposited by electroless deposition techniques. Even more preferably (i) the first metal layer comprises copper or copper alloy and is deposited by electroless plating and (ii) the second metal layer comprises nickel or nickel alloy, and is deposited by electroless plating onto the first metal layer.

In another case the following is preferred: (i) the first metal layer comprises (i-a) nickel or nickel alloy (preferably nickel) or (i-b) copper or copper alloy (preferably copper), and is deposited by electroless plating, and (ii) the second metal layer comprises (ii-a) nickel or nickel alloy or (ii-b) copper or cops per alloy, and is deposited by electrolytic plating onto the first metal layer. Preferably, the second metal layer comprises nickel alloy, more preferably nickel/iron alloy.

In another case the following is preferred: (i) the first metal layer comprises (i-a) nickel or nickel alloy (preferably nickel) or (i-b) copper or copper alloy (preferably copper), and is deposited by electroless plating, and (ii) the second metal layer comprises (ii-a) copper or copper alloy or (ii-b) tin or tin alloy, and is deposited by immersion plating (i.e. a replacement reaction) onto the first metal layer. The third metal layer comprises (iii-a) nickel or nickel alloy or (iii-b) copper or copper alloy, and is deposited by electrolytic plating onto the second metal layer (i.e. onto the layer present after the immersion plating). Preferably, the third metal layer comprises copper or copper alloy, more preferably copper. The fourth metal layer comprises (vi-a) nickel or nickel alloy or (vi-b) copper or copper alloy, and is deposited by electroless or electrolytic plating onto the third metal layer. Preferably, the fourth metal layer is deposited by electrolytic plating, the layer preferably comprising nickel alloy, more preferably nickel/iron alloy.

Most preferred is: (i) the first metal layer comprises (i-a) nickel or (i-b) copper, and is deposited by electroless plating, and (ii) the second metal layer comprises (ii-a) nickel or (ii-b) copper or (ii-c) nickel/iron alloy, and is deposited by electrolytic plating onto the first metal layer, preferably the second metal layer comprises (ii-c) nickel/iron alloy.

In another particular case at least three metal layers are preferred (preferably only three metal layers are deposited). Preferably, the deposition sequence is the following: for the first metal layer a deposition by electroless plating, thereafter for the second metal layer a deposition by electrolytic deposition onto the first metal layer, thereafter for the third metal layer a deposition by electroless plating onto the second metal layer. More preferably, the deposition sequence is the following: the first metal layer comprises nickel or nickel alloy (preferably nickel) and is deposited by electroless plating, thereafter the second metal layer comprises copper or copper alloy (preferably copper) and is deposited by electrolytic deposition onto the first metal layer, thereafter the third metal layer comprises nickel or nickel alloy (preferably nickel) and is deposited by electroless plating onto the second metal layer.

Any metal depositing bath can be used for the subsequent electrolytic metallisation, for example for depositing nickel, copper, silver, gold, tin, zinc, iron, lead or their alloys. This type of depositing bath is well known to the person skilled in the art. A Watts nickel bath is normally used as a bright nickel bath which contains nickel sulfate, nickel chloride and boric acid as well as saccharine as an additive. As a bright copper bath a composition is used which, for example, contains copper sulfate, sulfuric acid, sodium chloride as well as organic sulfur compounds, in which the sulfur is present in a low oxidation stage, for example as an organic sulfide or disulfide, as additives.

If a direct electroplating process is used, that is, a first metal layer is not deposited electrolessly but rather after treatment of the objects or the substrates with the conversion solution and deposited electrolytically after the optional subsequent rinsing treatment, then an electrolytic metallisation bath is used, for example a nickel strike bath, which is preferably composed on the basis of a Watts nickel bath. These types of baths for example contain nickel sulfate, nickel chloride and boric acid and saccharine as an additive.

For the purposes of the present invention electrolytic plating of copper and nickel as metal is particularly preferred. In these applications the total thickness of the deposited metal layers, preferably copper and/or, generally ranges between 0.5 and 300 μm. For thermal management applications, the thickness is preferred in the higher range of between 20 to 300 μm, more preferably between 50 and 200 μm. For EMI shielding applications the overall thickness of the metal layers preferably ranges between 1 and 100 μm, more preferred between 2 and 50 μm and even more preferred between 5 and 30 μm.

According to preferred embodiments of the present invention the sequence of metal layers which are deposited in step (iv) comprise:

a) copper (electroless) as the first metal layer and copper (electrolytic) as the second metal layer, both of which have an overall thickness according to the above described ranges.

b) nickel (electroless) as the first metal layer and nickel (electrolytic) as the second metal layer, both of which have an overall thickness according to the above described ranges.

c) nickel or copper (electroless) as the first metal layer and nickel or copper (electrolytic) as the second metal layer, both of which have an overall thickness according to the above described ranges.

d) nickel or copper (electroless) as the first metal layer and nickel or copper (electrolytic) as the second and third metal layer, both of which have an overall thickness according to the above described ranges.

For the metal layers according to a) to d) the preferred thickness of the electroless layer ranges between 0.5 and 20 μm and the preferred thickness of the electrolytic layer ranges between 0.5 and 300 μm.

One major concern with respect to the adhesion of the plated metal to the EMC is the internal stress of the metal layer. High internal stress reduces the peel strength and can even cause local delamination or blisters.

Heat treating the deposited metal layers greatly increases the peel strength (PS) of the metal layer to the underlying substrate. Such heat treatment is also called annealing. Annealing is a known treatment method to alter the material properties of the metal and for example increases its ductility, relieves internal stress and refines the metal structure by making it homogeneous.

Such heat treatment is performed in step v. according to the method of the present invention after the final metal plating step:

v. heating of the at least one metal plated layer to a temperature of between 100° C. and 300° C.

The heat treatment step can be performed after each metal plating step or after the final metal plating step only.

For this heat treatment the substrate is slowly heated to a maximum temperature of between 100° C. and 300° C., preferably up to a maximum temperature of 250° C. and even more preferred up to a maximum temperature of 200° C. The treatment time varies depending on the substrate material, the plated metal and the thickness of the plated metal layer and can be determined by routine experiments by the person skilled in the art. Generally, the treatment time ranges between 5 minutes and 120 minutes preferably between 10 minutes and 60 minutes and even more preferred a treatment time of up to 20 minutes, 30 minutes or 40 minutes is sufficient.

The best annealing process temperature depends on the targeted performance, the resin $T_g$, or the acceptable level of oxidation.

Preferably after annealing, the protective layer (15) on the back side (14) is removed. Alternatively, the protective layer may be removed after the metallisation in step (iv). Thereafter, the substrate is fully diced.

EXAMPLE

The following experiments are meant to illustrate the benefits of the present invention without limiting its scope.

In the experiments aminopropyltriethoxysilane as organosilane compound was employed. Isopropanol was used as organic solvent.

Two materials for the active component (substrate) were used in the examples, both of which are silica-filled epoxy based materials. Substrate material 1 was Sumitomo E770D (denoted A in Table 2) and Hitachi CEL (denoted B in Table 2). Two different batches (Batch 1 and Batch 2 in Table 2) of the substrate materials were used. A total of 4 samples were treated from each batch. The values are provided in Table 2 and are the average peel strength values measured out of the 4 samples.

Solutions were freshly made up before spraying. Silane content was 1 wt. % for all experiments performed.

Silane application: The solution was sprayed onto the substrate using the ExactaCoat spray device by Sonotek. Following parameters were set for all investigations:
Flow rate: 4 ml/min. (6 ml/min.)
Nozzle Distance: 8 cm
Nozzle Speed: 175 mm/s
Overlap: 12 mm
Nitrogen flow: 1.2 mPa
One spray cycle.

The samples were baked immediately after spraying at 125° C. for 15 min.

Optionally, the samples can be treated in a permanganate based solution before or after the silane is applied to the substrate surface, e.g. in an aqueous solution containing 45 g/l $MnO_4^-$ and 45 g/l NaOH.

Thereafter, the samples were metal plated according to the process parameters provided in Table 1. Table 1 comprises the process sequence applied to finally deposit 0.8 μm of electroless copper and 10 μm electrolytically deposited copper on the substrate material. Steps 1 and 2 (Neoganth) are commercial products from Atotech Deutschland GmbH used to form a palladium-based activation layer.

TABLE 1

Parameters used for subsequent metal plating

| Step No. | Name | T [° C.] | t [min] |
|---|---|---|---|
| 1 | Neoganth Activator Di Rinse | 40 | 4 |
| 2 | Neoganth Reducer Di Rinse | 30 | 3 |
| 3 | Electroless Cu Di Rinse, air dry | 34 | 15 |
| 4 | Electroless Cu Annealing | 150 | 30 |
| 5 | $H_2SO_4$ Pre-Dip | 25 | 1 |
| 6 | Acid Cu Current Density: 2 A/dm² Copper Thickness: 10 μm Di Rinse, air dry | 25 | 90 |
| 17 | Acid Cu Annealing | 180 | 60 |

Peel strength measurements of the plated metal layer to the substrate were performed by routing the samples in stripes of 1 cm width and 3 cm length after final annealing. Peel strength measurements were performed with an Erichsen Wuppertal 708 strain gauge using a Chatillon LTCM-6 pulling mechanism. The adhesion values for all samples are depicted in Table 2.

TABLE 2

Peel strength values for metal layers obtained according to a method of the present invention

| | (N/cm) | |
|---|---|---|
| Material | Mean | Pst Rfl |
| A - Batch 1 | 4.3 | 4.8 |
| A - Batch 2 | 4.6 | 4.9 |
| B - Batch 1 | 4.0 | 3.8 |
| B - Batch 2 | 3.7 | 4.1 |

The peel strength values obtained are about 4 N/cm or higher and are suitable for EMI and thermal management applications. "Pst Rfl" are the peel strength values obtained after post reflow at elevated temperatures which is used to mimic heat shocks which appear to the substrate during solder operations in industrial processes. It is particularly advantageous that the method according to the present invention provides a process for forming one or more metal layers wherein the peel strength values are not negatively affected by such post reflow.

REFERENCE SIGNS 10 active component
11 front side of active component
12 chip
13 layer of molding compound
14 back side of active component
15 protective layer
16 adhesion promotion layer
17 at least one metal layer

The invention claimed is:

1. Method for forming a metal layer for electromagnetic shielding and thermal management of active components, comprising the following steps
(i) providing at least one active component, said active component having a front side comprising at least one chip encased by a layer of molding compound, a back side and side walls;

(ii) forming on the back side a protective layer selected from a layer formed by lamination of an adhesive tape, a UV peelable tape and a layer of temporary ink;
(iii) forming on the front side and optionally on the side walls an adhesion promotion layer;
(iv) forming at least one metal layer on the adhesion promotion layer or
forming at least one metal layer on the adhesion promotion layer by wet chemical metal plating processes,
(v) heating of the at least one metal plated layer to a temperature of between 100° C. and 300° C.,
wherein the protective layer is removed after step (iv) or (v).

2. Method of claim 1, wherein the back side of the active component comprises electrical interconnects or I/Os with optional solder balls.

3. Method of claim 1, wherein forming an adhesion promotion layer applied according to step (iii) comprises
iiia. depositing on the layer of molding compound a layer of silane based adhesion promoter.

4. Method according to claim 3, wherein the silane based adhesion promoter is an organosilane compound selected from the group represented by the formula $A_{(4-x)}SiB_x$ wherein
each A is independently a hydrolyzable group,
x is 1 to 3, and
each B is independently selected from the group consisting of $C_1$-$C_{20}$ alkyl, aryl, amino aryl and a functional group represented by the formula $C_nH_{2n}X$, wherein
n is from 0 to 15, and
X is selected from the group consisting of amino, amido, hydroxy, alkoxy, halo, mercapto, carboxy, carboxy ester, carboxamide, thiocarboxamide, acyl, vinyl, allyl, styryl, epoxy, epoxycyclohexyl, glycidoxy, isocyanato, thiocyanato, thioisocyanato, ureido, thioureido, guanidino, thioglycidoxy, acryloxy, methacryloxy groups; or X is a residue of a carboxy ester; or X is $Si(OR)_3$, and wherein R is a $C_1$-$C_5$ alkyl group.

5. Method according to claim 4 wherein the hydrolyzable group A is selected from the group consisting of —OH, —OR$^1$ and wherein R$^1$ is $C_1$-$C_5$ alkyl, —(CH$_2$)$_y$OR$^2$ and wherein y is 1, 2 or 3 and R$^2$ is H or $C_1$-$C_5$ alkyl, —OCOR$^3$ and wherein R$^3$ is H or $C_1$-$C_5$ alkyl.

6. Method according to claim 3, wherein the layer of silane based adhesion promoter has a thickness of between 5 to 100 nm.

7. Method of claim 1, wherein forming a metal layer according to step (iv) comprises
iva. contacting the substrate with a noble metal colloid or a noble metal ion containing solution; and then
ivb. contacting the substrate with at least one electroless metal plating solution.

8. Method of claim 1, wherein forming a metal layer according to step (iv) comprises
iva. contacting the substrate with a noble metal colloid or a noble metal ion containing solution; next
ivb. contacting the substrate with at least one electroless metal plating solution; and then
ivc. contacting the substrate with at least one electrolytic metal plating solution.

9. Method for electromagnetic shielding, comprising carrying out the method according to claim 1, wherein the overall thickness of the metal layers ranges between 1 and 100 μm.

10. Method for thermal management, comprising carrying out the method according to claim 1, wherein the overall thickness of the metal layers ranges between 20 to 300 μm.

11. Method according to claim 7, wherein the electroless metal plating according to step ivb comprises both electroless nickel plating resulting in a nickel layer having a thickness of between 0.5 and 20 μm and electroless copper plating resulting in a copper layer having a thickness of between 0.5 and 20 μm.

12. Method according to claim 8, wherein the electrolytic metal plating according to step ivc comprises electrolytic nickel plating resulting in a nickel layer having a thickness of between 0.5 and 300 μm and electrolytic copper plating resulting in a copper layer having a thickness of between 0.5 and 300 μm.

13. Method according to claim 8, wherein the electroless metal plating according to step ivb comprises both electroless nickel plating resulting in a nickel layer having a thickness of between 0.5 and 20 μm and electroless copper plating resulting in a copper layer having a thickness of between 0.5 and 20 μm.

14. Method according to claim 1, wherein the at least one active component in step (i) is selected from pre-diced strips, singulated chips with solder balls, and singulated chips without solder balls.

15. Method according to claim 1, wherein the adhesion promotion layer comprises one or more than one organic compound.

16. Method according to claim 1, wherein the adhesion promotion layer does not contain iron, nickel and zinc.

17. Method according to claim 1, wherein the active component is fully diced after the protective layer is removed.

* * * * *